(12) United States Patent
Cobo et al.

(10) Patent No.: US 9,201,088 B2
(45) Date of Patent: Dec. 1, 2015

(54) IDENTIFYING PHYSICAL LOCATIONS OF DEVICES WITHIN AN ELECTRONIC SYSTEM

(71) Applicant: Lenovo Enterprise Solutions (Singapore) Pte. Ltd., Singapore (SG)

(72) Inventors: Milton Cobo, Raleigh, NC (US); Steven C. Jacobson, Mebane, NC (US); Luke D. Remis, Raleigh, NC (US); Gregory D. Sellman, Morrisville, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 147 days.

(21) Appl. No.: 13/974,526

(22) Filed: Aug. 23, 2013

(65) Prior Publication Data
US 2015/0053020 A1    Feb. 26, 2015

(51) Int. Cl.
G01F 1/28     (2006.01)
G01P 5/02     (2006.01)
G01B 13/03    (2006.01)
G06F 1/20     (2006.01)

(52) U.S. Cl.
CPC . *G01P 5/02* (2013.01); *G01B 13/03* (2013.01); *G06F 1/203* (2013.01)

(58) Field of Classification Search
CPC ....... G01B 13/12; H05K 7/20145; G01P 5/02
USPC ....................................... 73/861.75
See application file for complete search history.

(56) References Cited

U.S. PATENT DOCUMENTS

| | | | |
|---|---|---|---|
| 4,781,065 A * | 11/1988 | Cole | 73/198 |
| 8,032,331 B2 | 10/2011 | Dalton et al. | |
| 2003/0046339 A1* | 3/2003 | Ip | 709/203 |
| 2003/0214785 A1 | 11/2003 | Perazzo | |
| 2006/0005555 A1 | 1/2006 | Alappat et al. | |

(Continued)

OTHER PUBLICATIONS

Authors: Jeonghwan Choi, Youngjae Kim, Anand Sivasubramaniam, Jelena Srebric, Qian Wang and Joonwon Lee, Title: A CDF-Based Tool for Studying Temperature in Rack-Mounted Servers, Date: Aug. 2008, Publisher: IEEE Transactions of Computers, vol. 57, No. 8, pp. 1129-1142.*

(Continued)

*Primary Examiner* — Lisa Caputo
*Assistant Examiner* — Roger Hernandez-Prewitt
(74) *Attorney, Agent, or Firm* — Law Office of Jim Boice

(57) ABSTRACT

A system comprises a plurality of fans, wherein each of the fans is configurable to run at a unique fan speed that is different from fan speeds of other fans from the plurality of fans. A plurality of variable-positioned devices, capable of being positioned at various locations within the system, are physically positioned such that airflow from one of the plurality of fans strikes a particular variable-positioned device. A plurality of anemometers, each of which is connected to a particular variable-positioned device, measure airflow across the variable-positioned devices. A system controller, which contains location information that identifies a physical position within the system of each of the plurality of fans, utilizes airflow readings from each of the anemometers to identify a physical location of each of the plurality of variable-positioned devices by matching physical locations of the fans to measured airflow across the variable-positioned devices.

9 Claims, 3 Drawing Sheets

(56) References Cited

U.S. PATENT DOCUMENTS

2011/0215946 A1* 9/2011 Aguren ............... 340/870.3
2012/0215359 A1* 8/2012 Michael et al. ........... 700/275

OTHER PUBLICATIONS

Authors: Joachim Preiss and Raouf Ismail, Title: Accurate Air Flow Measurement in Electronics Cooling, Date: Jun. 2001, Publisher: TelTherm, Thermal & Reliability Engineering, vol. 6, pp. 1-8.*

* cited by examiner

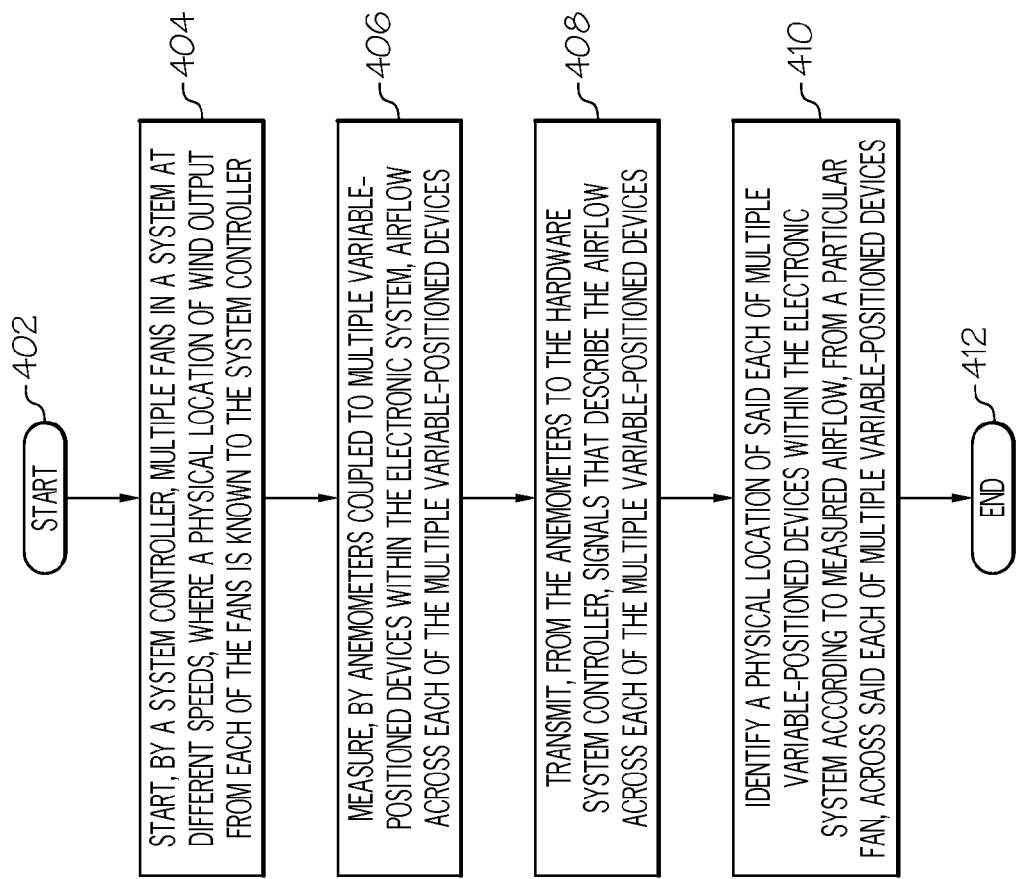

IDENTIFYING PHYSICAL LOCATIONS OF DEVICES WITHIN AN ELECTRONIC SYSTEM

BACKGROUND

The present disclosure relates to the field of electronic systems, and specifically to electronic systems that include repositionable devices. Still more particularly, the present disclosure relates to identifying the physical positions of one or more devices within an electronic system.

Many electronic systems include fixed-positioned devices and variable-positioned devices. For example, a personal computer may include a fixed-positioned motherboard, to which are attached multiple variable-positioned devices, such as hard drives, memory cards, and adapter cards such as video cards, sound cards, network cards, modems, etc.

SUMMARY

In one embodiment of the present invention, a system comprises a plurality of fans, wherein each of the fans is configurable to run at a unique fan speed that is different from fan speeds of other fans from the plurality of fans. A plurality of variable-positioned devices, capable of being positioned at various locations within the system, are physically positioned such that airflow from one of the plurality of fans strikes a particular variable-positioned device. A plurality of anemometers, each of which is connected to a particular variable-positioned device, measure airflow across the variable-positioned devices. A system controller, which contains location information that identifies a physical position within the system of each of the plurality of fans, utilizes airflow readings from each of the anemometers to identify a physical location of each of the plurality of variable-positioned devices by matching physical locations of the fans to measured airflow across the variable-positioned devices.

In one embodiment of the present invention, a method and/or computer program product identifies physical locations of multiple devices within an electronic system. A hardware system controller in the electronic system activates multiple fans in the system at different speeds, where a physical location of wind output from each of the fans is known to the hardware system controller. Anemometers, coupled to each of multiple variable-positioned devices within the electronic system, measure airflow across each of the multiple variable-positioned devices. The anemometers then transmit, to the hardware system controller, signals that describe the airflow across one or more of the multiple variable-positioned devices. The hardware system controller then identifies a physical location of each of the multiple variable-positioned devices within the electronic system according to measured airflow, from a particular fan, across each of the multiple variable-positioned devices.

In one embodiment of the present invention, a method and/or computer program product identifies a physical location of a single device within an electronic system. A hardware system controller in the electronic system activates a specific fan in the system at a specific speed, where a physical location of wind output from the specific fan is known to the hardware system controller. An anemometer, coupled to a particular variable-positioned device within the electronic system, measures airflow across the particular variable-positioned device. The hardware system controller then identifies a physical location of the particular variable-positioned device within the electronic system according to measured airflow, from the specific fan, across the particular variable-positioned device.

BRIEF DESCRIPTION OF SEVERAL VIEWS OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIG. 4 is a high level flow chart of exemplary steps taken to identify physical locations of variable-positioned devices within an electronic system.

DETAILED DESCRIPTION

Figure 1:
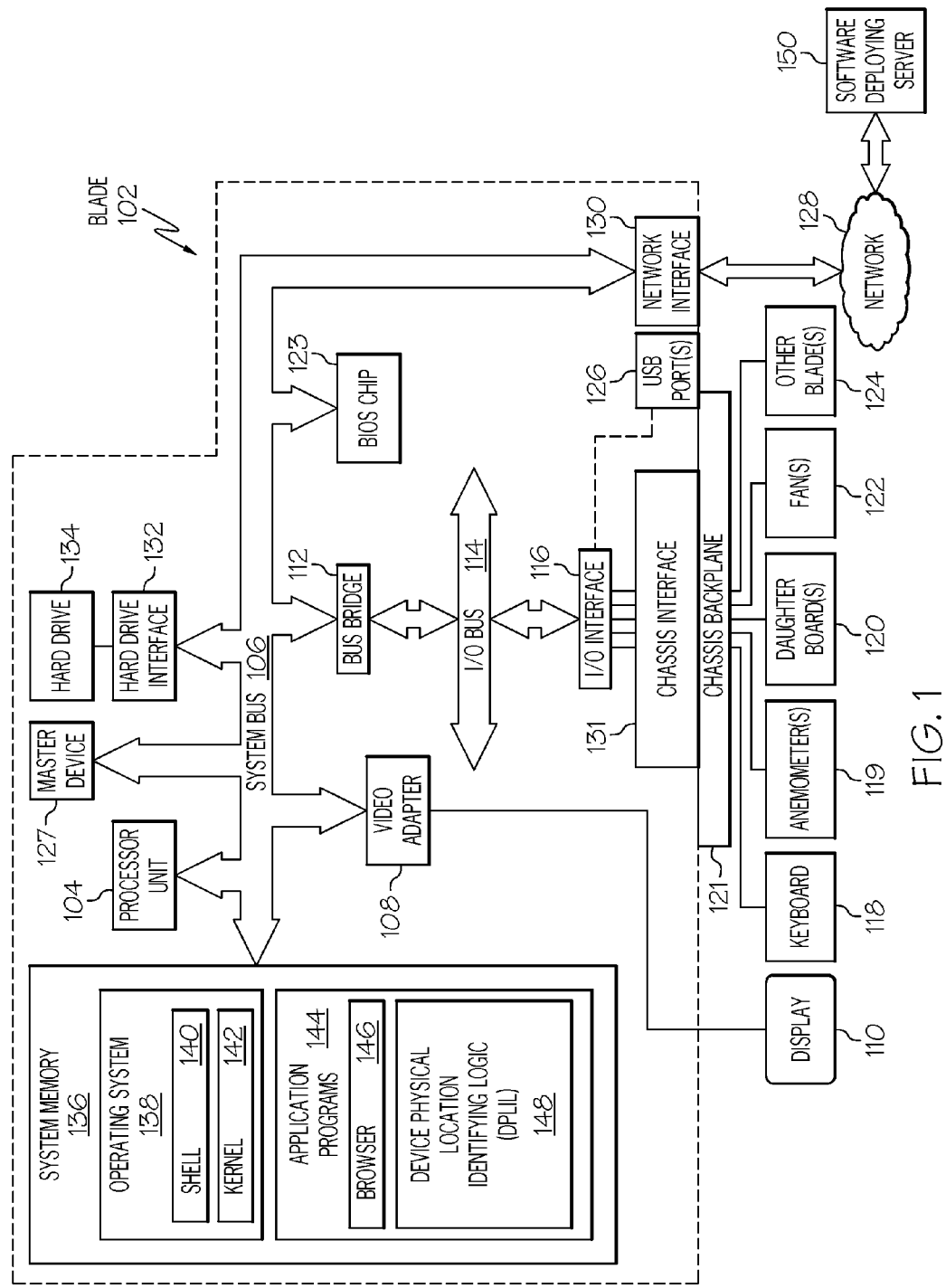
FIG. 1 depicts an exemplary computer that may be utilized by the present invention.
Figure 2:
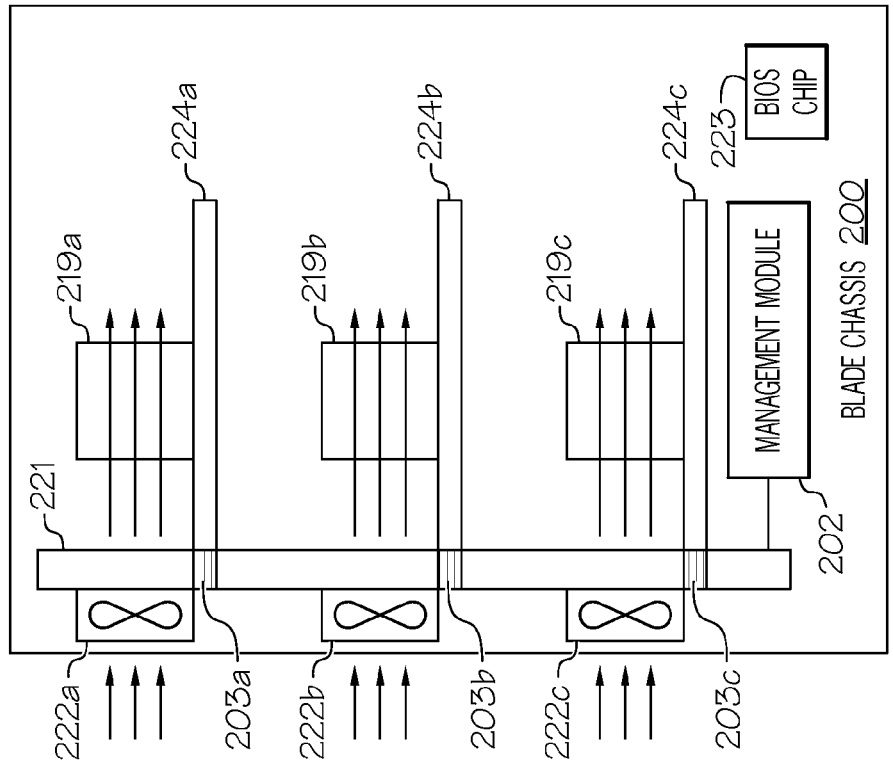
FIG. 2 illustrates an exemplary blade chassis in which the present invention may be utilized.

With reference now to the figures, and in particular to FIG. 1, there is depicted a block diagram of an exemplary blade 102, which may be utilized by the present invention. Blade 102 is a component of a server blade chassis (depicted below in FIG. 2 as blade chassis 200). Blade chassis 200 shown in FIG. 2 is usually utilized as a server; thus, blade 102 may be referenced as a server blade. Note that some or all of the exemplary architecture shown for blade 102 may be utilized by software deploying server 150 and/or other blades 124 (e.g., blades 224a-224c depicted in FIG. 2, which may be within a same blade chassis as blade 102) and/or a management module (e.g., management module 202 depicted in FIG. 2) and/or a motherboard (e.g., motherboard 300 depicted in FIG. 3) in a computer system such as a personal computer.

Blade 102 includes a processor unit 104 that is coupled to a system bus 106. Processor unit 104 may utilize one or more processors, each of which has one or more processor cores. A video adapter 108, which drives/supports a display 110, is also coupled to system bus 106, either directly or via a chassis interface 131 to a chassis backplane 121.

System bus 106 is coupled via a bus bridge 112 to an Input/Output (I/O) bus 114. An I/O interface 116 is coupled to I/O bus 114. I/O interface 116 affords communication with various I/O devices (including USB port(s) 126) either directly or via the chassis interface 131, which is hardware and/or software that allows the blade 102 to be coupled to chassis backplane 121 in a blade chassis (described in further detail as chassis backplane 221 in FIG. 2). Once coupled to the chassis backplane 121, the blade 102 is able to communicate with other devices in addition to the display 110, including a keyboard 118, anemometer(s) 119, daughterboard(s) 120 (in the scenario in which blade 102 is a motherboard), fan(s) 122, and other blade(s) 124 that are within a blade chassis. While the format of the ports connected to I/O interface 116 may be any known to those skilled in the art of computer architecture, in a preferred embodiment some or all of these ports are Universal Serial Bus (USB) ports.

As depicted, blade 102 is able to communicate with a software deploying server 150 via network 128 using a network interface 130, which is coupled to system bus 106.

Network 128 may be an external network such as the Internet, or an internal network such as an Ethernet or a Virtual Private Network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in blade 102. This volatile memory includes additional higher levels of volatile memory (not shown), including, but not limited to, cache memory, registers and buffers. Data that populates system memory 136 includes blade 102's Operating System (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a World Wide Web (WWW) client (i.e., blade 102) to send and receive network messages to the Internet using HyperText Transfer Protocol (HTTP) messaging, thus enabling communication with software deploying server 150 and other described computer systems.

Application programs 144 in blade 102's system memory (as well as software deploying server 150's system memory) also include a device physical location identifying logic (DPLIL) 148. DPLIL 148 includes code for implementing the processes described below, including those described in FIGS. 2-4. In one embodiment, blade 102 is able to download DPLIL 148 from software deploying server 150, including in an on-demand basis. Note further that, in one embodiment of the present invention, software deploying server 150 performs all of the functions associated with the present invention (including execution of DPLIL 148), thus freeing blade 102 from having to use its own internal computing resources to execute DPLIL 148.

Note that, in one embodiment, blade 102 also includes a basic input/output system (BIOS) chip 123. BIOS chip 123 contains instructions to initialize and test hardware components of blade 102 during startup.

The hardware elements depicted in blade 102 are not intended to be exhaustive, but rather are representative to highlight essential components required by the present invention. For instance, blade 102 may include alternate memory storage devices such as magnetic cassettes, Digital Versatile Disks (DVDs), Bernoulli cartridges, and the like. These and other variations are intended to be within the spirit and scope of the present invention.

With reference now to FIG. 2, an exemplary blade chassis 200 in which the present invention may be utilized is depicted. Blade chassis 200 contains a backplane 221, to which multiple blades 224a-224c (where "c" is an integer) are coupled. Affixed, coupled, and/or connected to each of the blades 224a-224c is an anemometer, depicted as anemometers 219a-219c. Each of the anemometers 219a-219c is capable of measuring airflow across the surface of a particular blade. For example, consider blade 224a. A fan 222a (from multiple fans 222a-222c, some or all of which are physically mounted on the backplane 221) blows air across the face of blade 224a. Anemometer 219a, which is connected to blade 224a, measures the airflow from fan 222a. In one embodiment, anemometer 219a (like all of the other anemometers 219a-219c) contains an impeller, which turns in proportion to the amount of airflow ("wind") moving through the anemometer 219a. Logic within the anemometer 219a converts this impeller movement into air speed, which is conveyed as a signal to a management module 202, which controls the operation of blade chassis 200. In another embodiment, one or more of the anemometers 219a-219c are thermometer-based. That is, a thermometer-based anemometer knows a nominal temperature of a device with no coolant (i.e., air flowing across it). By measuring a drop in surface temperature on that device, the thermometer-based anemometer is able to correlate the drop in temperature with the amount of airflow that would cause such a drop in temperature. For example, if the thermometer detects that the surface temperature of a device drops from 80° C. to 70° C., logic within the thermometer-based anemometer may calculate (or find on a lookup table) that there must be 50 CFM (cubic feet per minute) of air flowing across the device. Similarly, if the thermometer detects that the surface temperature of a device drops from 80° C. to 60° C., logic within the thermometer-based anemometer may calculate (or find on a lookup table) that there must be 100 CFM of air flowing across the device.

During a startup process, which may be initiated during booting up by a basic input/output system (BIOS) chip 223 (e.g., BIOS chip 123 shown in FIG. 1), the management module 202 (or other logic such as the BIOS chip 223) will run (simultaneously or sequentially) each of the fans 222a-222c at different speeds. For example, assume that, during startup, the BIOS chip 223 instructs fan 222a to produce 25 CFM of air, fan 222b to produce 50 CFM of air, and fan 222c to produce 100 CFM of air. These different airflow speeds are respectively detected by anemometers 219a, 219b, and 219c. The BIOS chip 223 and/or management module 202 includes information about the physical location of each of the fans 222a-222c. Thus, if the management module 202 and/or BIOS chip 223 receives a signal from anemometer 219a of an airspeed measurement at or near 25 CFM, then the management module 202 and/or BIOS chip 223 is able to identify the location of blade 224a as being in a slot 203a (from slots 203a-203c) that is proximate to fan 222a. Similarly, if the management module 202 and/or BIOS chip 223 receives a signal from anemometer 219b of an airspeed measurement at or near 50 CFM, then the management module 202 and/or BIOS chip 223 is able to identify the location of blade 224b as being in a slot 203b that is proximate to fan 222b. Likewise, if the management module 202 and/or BIOS chip 223 receives a signal from anemometer 219c of an airspeed measurement at or near 100 CFM, then the management module 202 and/or BIOS chip 223 is able to identify the location of blade 224c as being in a slot 203c that is proximate to fan 222c.

Figure 3:
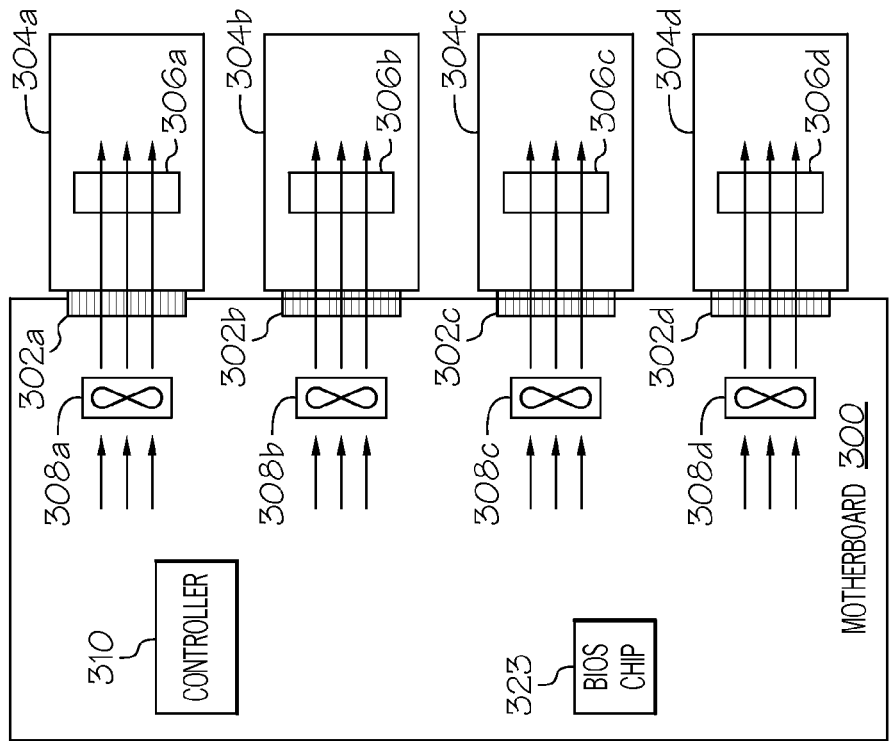
FIG. 3 depicts an exemplary computer in which the present invention may be utilized.

With reference now to FIG. 3, an exemplary computer 301 in which the present invention may be utilized is presented. Assume that computer 301, which may be a personal computer, has at least one motherboard 300. The motherboard 300 is a printed circuit board (PCB) that (unlike the backplane 221 shown in FIG. 2) not only is able to couple to peripheral and other devices, but also contains key electronic components of the computer system, such as the central processing unit (CPU) and system memory.

As depicted for exemplary purposes, motherboard 300 has multiple sockets 302a-302d (where "d" is an integer). As depicted, various daughterboards 304a-304d respectively plug into these multiple sockets 302a-302d. Affixed on or near the motherboard 300 are multiple fans 308a-308d, with each of the multiple fans 308a-308d being positioned at a physical location near one of the sockets 302a-302d. The physical locations of these fans 308a-308d are known to a hardware controller 310 and/or a BIOS chip 323 on the motherboard 300. Each of the daughterboards 304a-304d has affixed thereon an anemometer (from anemometers 306a-306d), which measures airflow from a specific fan from fans 308a-308d.

Thus, as with the blade chassis 200 described in FIG. 2, each of the anemometers 306a-306d sends a signal, indicating how much airflow is passing across the surface of each of the daughterboards 304a-304d, to a controller 310 (which controls the motherboard 300 and/or any device coupled to the motherboard 300) and/or BIOS chip 323. The controller 310 and/or BIOS chip "knows" the CFM of air being produced by each of the fans 308a-308d and the location of each of the fans 308a-308d. Thus, the amount of airflow measured by one or more of the anemometers 306a-306d allows the controller 310 and/or BIOS chip 323 to identify the location of one or more of the daughterboards 304a-304d. For example, if fan 308a is producing 25 CFM of air, and anemometer 306a detects airflow of approximately 25 CFM, then the controller 310 and/or BIOS chip 323 is able to determine that daughterboard 304a is connected to socket 302a, which is next to fan 308a. Similarly, if fan 308d is producing 100 CFM of air, and anemometer 306d detects airflow of approximately 100 CFM, then the controller 310 and/or BIOS chip 323 is able to determine that daughterboard 304d is connected to socket 302d, which is next to fan 308d.

With reference now to FIG. 4, a high level flow chart of exemplary steps taken to identify physical locations of variable-positioned devices within an electronic system is presented. "Variable-positioned devices" are defined as devices that may be positioned and coupled to a system at different locations, such as different sockets on a motherboard, different slots in a blade chassis, etc. Thus, a same device may be moved from one slot to another, from one socket to another, etc. The present invention allows a controller to know the current physical location of a variable-positioned device using airflow measurements across that variable-positioned device. Thus, there is no need for straps (i.e., pulling a line high or low to a device to identify its location), position ribbons (i.e., cables that are dedicated to a particular slot/socket), etc. for determining the physical location of a variable-positioned device.

After initiator block 402 in FIG. 4, which may be caused by a system starting up or rebooting, a hardware system controller (e.g., management module 202, BIOS chip 223, controller 310, and/or BIOS chip 323 depicted in FIGS. 2-3) in an electronic system activates multiple fans in the electronic system at different speeds (block 404). As described herein, a physical location of each of the fans, and thus a physical location of wind output from each of the fans, is known to the system controller.

As described in block 406, anemometers coupled to multiple variable-positioned devices within the electronic system measure airflow across each of the multiple variable-positioned devices. As described in block 408, the anemometers then transmit, to the hardware system controller, signals that describe the airflow across each of the multiple variable-positioned devices. As described in block 410, a physical location of each of the multiple variable-positioned devices within the electronic system is then identified according to measured airflow, from a particular fan, across each of the multiple variable-positioned devices. The process ends at terminator block 412.

In one embodiment, the fans run at different unique fan speeds during a predefined period of time during initialization of the system. That is, the fans are allowed to run at whatever speed is deemed necessary to adequately cool the variable-positioned device to which is it dedicated during normal operation. However, during startup, the fan speed is defined and controlled in order to identify a location of a specific variable-positioned device, rather than focusing on cooling that specific variable-positioned device.

As described in FIG. 2, in one embodiment the electronic system is a blade chassis, and the multiple variable-positioned devices are blades mounted to a backplane of the blade chassis. As described in FIG. 3, in one embodiment the electronic system is a computer (e.g., a personal computer) having a motherboard, and the multiple variable-positioned devices are daughterboards that are electrically coupled to the motherboard.

While the present invention has been described as identifying the physical locations of multiple variable-positioned devices, in one embodiment a single variable positioned device's location can be identified. That is, a hardware system controller in an electronic system activates a specific fan in the electronic system at a specific speed, where a physical location of wind output from the specific fan is known to the hardware system controller. An anemometer coupled to a particular variable-positioned device within the electronic system then measures airflow across the particular variable-positioned device. This allows logic such as a controller, BIOS chip, etc. to identify a physical location of the particular variable-positioned device within the electronic system according to measured airflow, from the specific fan, across the particular variable-positioned device.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, when is then applied to a VHDL chip, such as a FPGA. Applying the VHDL instructions to the VHDL chip not only causes a physical transformation of the VHDL chip, but such VHDL instruction application can also cause a specifically loaded VHDL chip to be newly coupled (physically and/or logically) to other hardware within a computer system, thus causing an additional physical transformation of the computer system.

Having thus described the invention of the present application in detail and by reference to illustrative embodiments thereof, it will be apparent that modifications and variations are possible without departing from the scope of the invention defined in the appended claims.

What is claimed is:
1. A system comprising:
   a plurality of fans, wherein each of the fans is configurable to run at a unique fan speed that is different from fan speeds of other fans from the plurality of fans, wherein each of the plurality of fans runs at a different unique fan speed during a predefined period of time during initialization of the system;

a hardware controller, wherein physical locations of all of the plurality of fans are known to the hardware controller;

a plurality of variable-positioned devices, wherein the plurality of variable-positioned devices are capable of being positioned at various locations within the system, and wherein each of the plurality of variable-positioned devices is physically positioned such that airflow from one of the plurality of fans strikes a particular variable-positioned device;

a plurality of anemometers, wherein each of the anemometers is connected to a particular variable-positioned device, from the plurality of variable-positioned devices, for measuring airflow across the particular variable-positioned device, and wherein the anemometers are capable of transmitting airflow readings that describe the airflow across each of the multiple variable-positioned devices; and a system controller, wherein the system controller contains location information that determines a physical position within the system of each of the plurality of fans, and wherein the system controller utilizes airflow readings received from each of the anemometers to determine a physical location of each of the plurality of variable-positioned devices by matching known physical locations of the fans to measured airflow across the variable-positioned devices.

2. The system of claim 1, wherein the system is a blade chassis, and wherein the variable-positioned devices are server blades that are removably inserted into blade slots on a backplane of the blade chassis.

3. The system of claim 1, wherein the system is a computer system having a motherboard, and wherein the variable-positioned devices are daughterboards that are removably inserted into sockets on the motherboard.

4. A method of identifying physical locations of devices within an electronic system during a booting up procedure, the method comprising:

booting up an electronic system by initiating a basic input/output system (BIOS) chip in the electronic system, wherein the BIOS chip instructs each of multiple fans to operate at a specific speed, and wherein the BIOS chip identifies a physical location of each of the multiple fans and wherein each of the multiple fans runs at a different unique fan speed during a predefined period of time during initialization of the system;

activating, by executing instructions from the BIOS chip in a hardware system controller in the electronic system, each of the multiple fans in the electronic system at a different speed, where a physical location of wind output from each of the multiple fans is known to the hardware system controller;

measuring, by anemometers coupled to multiple variable-positioned devices within the electronic system, airflow across each of the multiple variable-positioned devices that are cooled by the multiple fans;

transmitting, from the anemometers to the hardware system controller, signals that describe the airflow across each of the multiple variable-positioned devices; and determining, by the hardware system controller in the electronic system, a physical location of said each of the multiple variable-positioned devices within the electronic system according to measured airflow, from a particular fan at a known physical location, across each of the multiple variable-positioned devices.

5. The method of claim 4, wherein the electronic system is a blade chassis, and wherein the multiple variable-positioned devices are blades mounted to a backplane of the blade chassis.

6. The method of claim 4, wherein the electronic system is a computer having a motherboard, and wherein the multiple variable-positioned devices are daughterboards that are electrically coupled to the motherboard.

7. A computer program product for identifying physical locations of devices within an electronic system, the computer program product comprising a computer readable storage medium having program code embodied therewith, the program code readable and executable by a processor to perform a method comprising:

activating, by a hardware system controller in an electronic system, a specific fan in the electronic system at a specific speed, wherein the specific fan runs at the specific speed during a predefined period of time during initialization of the system, wherein a physical location of wind output from the specific fan is known to the hardware system controller, and wherein a physical location of the specific fan is known to a hardware controller;

measuring, by an anemometer coupled to a particular variable-positioned device within the electronic system, airflow across the particular variable-positioned device;

transmitting, from the anemometer to the hardware system controller, a signal that describes the airflow across the particular variable-positioned device; and determining a physical location of the particular variable-positioned device within the electronic system according to measured airflow, from the specific fan that is at a known physical location, across the particular variable-positioned device.

8. The computer program product of claim 7, wherein the electronic system is a blade chassis, and wherein the particular variable-positioned device is a blade mounted to a backplane of the blade chassis.

9. The computer program product of claim 7, wherein the electronic system is a computer having a motherboard, and wherein the particular variable-positioned device is a daughterboard that is electrically coupled to the motherboard.

* * * * *